(12) United States Patent
Long et al.

(10) Patent No.: US 7,501,152 B2
(45) Date of Patent: *Mar. 10, 2009

(54) DELIVERING PARTICULATE MATERIAL TO A VAPORIZATION ZONE

(75) Inventors: Michael Long, Hilton, NY (US); Jeremy M. Grace, Penfield, NY (US); Bruce E. Koppe, Caledonia, NY (US)

(73) Assignee: Eastman Kodak Company, Rochester, NY (US)

( * ) Notice: Subject to any disclaimer, the term of this patent is extended or adjusted under 35 U.S.C. 154(b) by 707 days.

This patent is subject to a terminal disclaimer.

(21) Appl. No.: 11/134,654

(22) Filed: May 20, 2005

(65) Prior Publication Data

US 2006/0062920 A1    Mar. 23, 2006

Related U.S. Application Data

(63) Continuation-in-part of application No. 10/945,940, filed on Sep. 21, 2004, now Pat. No. 7,288,285.

(51) Int. Cl.
    *C23C 16/00* (2006.01)
(52) U.S. Cl. ................... 427/248.1; 427/255.7
(58) Field of Classification Search ........................ None
    See application file for complete search history.

(56) References Cited

U.S. PATENT DOCUMENTS

| 2,447,789 | A |   | 8/1948  | Barr |
| 4,769,292 | A |   | 9/1988  | Tang et al. |
| 4,885,211 | A |   | 12/1989 | Tang et al. |
| 5,263,267 | A |   | 11/1993 | Buttner et al. |
| 5,475,144 | A | * | 12/1995 | Watson et al. ............... 568/301 |
| 5,945,163 | A |   | 8/1999  | Powell et al. |
| 6,291,031 | B1 | * | 9/2001 | Okazaki et al. ............. 427/593 |
| 2006/0062915 | A1 | * | 3/2006 | Long et al. ............... 427/248.1 |

FOREIGN PATENT DOCUMENTS

| EP | 0 337 369 | 10/1989 |
| EP | 0 585 848 | 3/1994 |
| EP | 0982411 | 3/2000 |
| GB | 502576 | 3/1939 |

OTHER PUBLICATIONS

J. A. Shepherd et al., Design and Performance of a Novel Powder Flash Evaporator, Journal of Vacuum Science & Technology, vol. 11, Jul. 1, 1993, pp. 1451-1453.

* cited by examiner

*Primary Examiner*—Timothy Meeks
*Assistant Examiner*—Kelly M Stouffer
(74) *Attorney, Agent, or Firm*—Raymond L. Owens (57) ABSTRACT

A method for vaporizing particulate materials and condensing them onto a surface to form a layer provides a quantity of particulate material in a first container having an opening, dimensioned to allow free flow of the particulate material through the opening. The particulate material is transferred through the opening to an auger. At least a portion of the auger is rotated to transfer the particulate material from the first container along a feeding path to a vaporization zone where at least a component portion of the particulate material is vaporized and delivered to the surface to form the layer. The auger size is selected to facilitate the free flow of the particulate material through the opening.

4 Claims, 7 Drawing Sheets

DELIVERING PARTICULATE MATERIAL TO A VAPORIZATION ZONE

CROSS REFERENCE TO RELATED APPLICATIONS

The present application is a continuation in part of U.S. patent application Ser. No. 10/945,940, filed Sep. 21, 2004, now U.S. Pat. No. 7,288,285, entitled "Delivering Organic Powder to a Vaporization Zone" by Long et al.

Reference is also made to commonly assigned U.S. patent application Ser. No. 10/805,980 filed Mar. 22, 2004 entitled "Vaporizing Fluidized Organic Materials" by Long et al., U.S. patent application Ser. No. 10/784,585 filed Feb. 23, 2004, entitled "Device and Method for Vaporizing Temperature Sensitive Materials" by Long et al. and U.S. patent application Ser. No. 10/945,941, filed Sep. 21, 2004, entitled "Delivering Organic Powder to a Vaporization Zone" by Long et al, the disclosures of which are incorporated herein by reference.

FIELD OF THE INVENTION

The present invention relates to the field of physical vapor deposition of particulate material.

BACKGROUND OF THE INVENTION

An OLED device includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Physical vapor deposition in a vacuum environment is the principal means of depositing thin organic material films as used in small molecule OLED devices. Such methods are well known, for example Barr in U.S. Pat. No. 2,447,789 and Tanabe et al. in EP 0 982 411. The organic materials used in the manufacture of OLED devices are often subject to degradation when maintained at or near the desired rate dependant vaporization temperature for extended periods of time. Exposure of sensitive organic materials to higher temperatures can cause changes in the structure of the molecules and associated changes in material properties.

To overcome the thermal sensitivity of these materials, only small quantities of organic materials have been loaded in sources and they are heated as little as possible. In this manner, the material is consumed before it has reached the temperature exposure threshold to cause significant degradation. The limitations with this practice are that the available vaporization rate is very low due to the limitation on heater temperature, and the operation time of the source is very short due to the small quantity of material present in the source. In the prior art, it has been necessary to vent the deposition chamber, disassemble and clean the vapor source, refill the source, reestablish vacuum in the deposition chamber and degas the just-introduced organic material over several hours before resuming operation. The low deposition rate and the frequent and time consuming process associated with recharging a source has placed substantial limitations on the throughput of OLED manufacturing facilities.

A secondary consequence of heating the entire organic material charge to roughly the same temperature is that it is impractical to mix additional organic materials, such as dopants, with a host material unless the vaporization behavior and vapor pressure of the dopant is very close to that of the host material. This is generally not the case and, as a result, prior art devices frequently require the use of separate sources to co-deposit host and dopant materials.

A consequence of using single component sources is that many sources are required in order to produce films containing a host and multiple dopants. These sources are arrayed one next to the other with the outer sources angled toward the center to approximate a co-deposition condition. In practice, the number of linear sources used to co-deposit different materials has been limited to three. This restriction has imposed a substantial limitation on the architecture of OLED devices, increases the necessary size and cost of the vacuum deposition chamber and decreases the reliability of the system.

Figure 1:
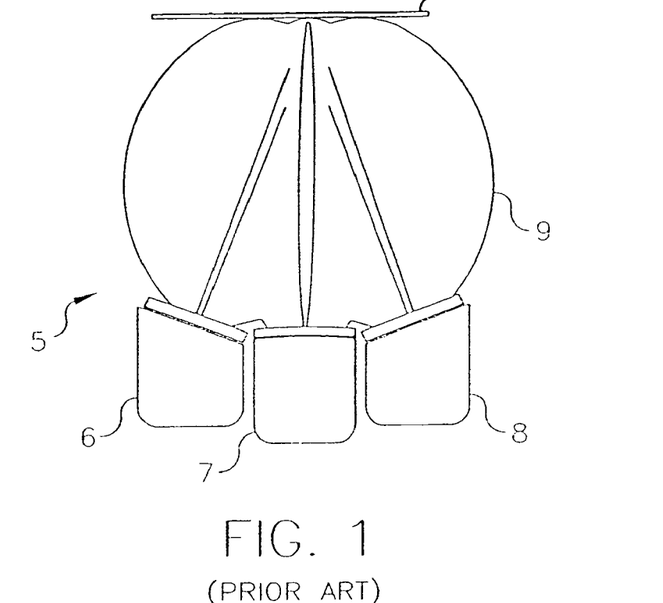
FIG. 1 is a cross-sectional view of a prior-art vaporization device.

Additionally, the use of separate sources creates a gradient effect in the deposited film where the material in the source closest to the advancing substrate is over represented in the initial film immediately adjacent the substrate while the material in the last source is over represented in the final film surface. This gradient co-deposition is unavoidable in prior art methods where a single material is vaporized from each of multiple sources. The gradient in the deposited film is especially evident when the contribution of either of the end sources is more than a few percent of the central source, such as when a co-host is used. FIG. 1 shows a cross-sectional view of such a prior-art vaporization device 5, which includes three individual sources 6, 7, and 8, commonly termed "heating boats", for vaporizing organic material. Vapor plume 9 is preferably homogeneous in the materials from the different sources, but in fact varies in composition from side to side resulting in a non-homogeneous coating on substrate 15.

A further limitation of prior art sources is that the geometry of the vapor manifold changes as the organic material charge is consumed. This change requires that the heater temperature change to maintain a constant vaporization rate and it is observed that the overall plume shape of the vapor exiting the orifices can change as a function of the organic material thickness and distribution in the source, particularly when the conductance to vapor flow in the source with a full charge of material is low enough to sustain pressure gradients from non-uniform vaporization within the source. In this case, as the material charge is consumed, the conductance increases and the pressure distribution and hence overall plume shape improve.

SUMMARY OF THE INVENTION

It is an object of the present invention to provide an effective way of transferring particulate material from a container to a vaporization zone.

This object is achieved by a method for vaporizing particulate materials and condensing them onto a surface to form a layer, comprising:

(a) providing a quantity of particulate material in a first container having an opening,
wherein the opening is dimensioned to allow free flow of the particulate material through the opening;

(b) transferring such particulate material through the opening to an auger; and, (c) rotating at least a portion of the auger to transfer the particulate material from the first container along a feeding path to a vaporization zone where at least a component portion of the particulate material is vaporized and delivered to the surface to form the layer, wherein the auger size is selected to facilitate the free flow of the particulate material through the opening.

It is an advantage of the present invention that the continuous heating of material during operation of prior art devices is eliminated in that only a small portion of particulate material is heated, for a short period of time and at a controlled rate. The bulk of particulate material is maintained at a temperature that can be as much as 300° C. cooler than the desired rate-dependent vaporization temperature. This can be particularly advantageous when vaporizing organic materials.

It is a further advantage of the present invention that it can maintain a steady vaporization rate with a continuously replenished charge of particulate material and with a steady heater temperature. The device thus allows extended operation of the source with substantially reduced risk of degrading even highly temperature-sensitive organic materials.

It is a further advantage of the present invention that it permits materials having different vaporization rates and degradation temperature thresholds to be co-sublimated in the same source.

It is a further advantage of the present invention that it permits linear vaporization rate control by controlling the volumetric metering rate or controlling the feed pressure of the compacted particulate material.

It is a further advantage of the present invention that it can rapidly stop and reinitiate vaporization and achieve a steady vaporization rate quickly by controlling the metering rate of the particulate material, minimizing contamination of the deposition chamber walls and conserving the particulate materials when a substrate is not being coated.

It is a further advantage that the present device achieves substantially higher vaporization rates than in prior art devices with substantially reduced material degradation. Further still, no heater temperature change is required as the source material is consumed.

It is a further advantage of the present invention that it can provide a vapor source in any orientation, which is frequently not possible with prior-art devices.

It is a further advantage of some embodiments of this invention that it can remove adsorbed gases from the particulate material through the use of heat and vacuum as a much smaller quantity of material is conveyed through the device.

BRIEF DESCRIPTION OF THE DRAWINGS

FIG. 6b is a cross-sectional view of the terminal end of the auger structure in FIG. 6a;

DETAILED DESCRIPTION OF THE INVENTION

Figure 2:
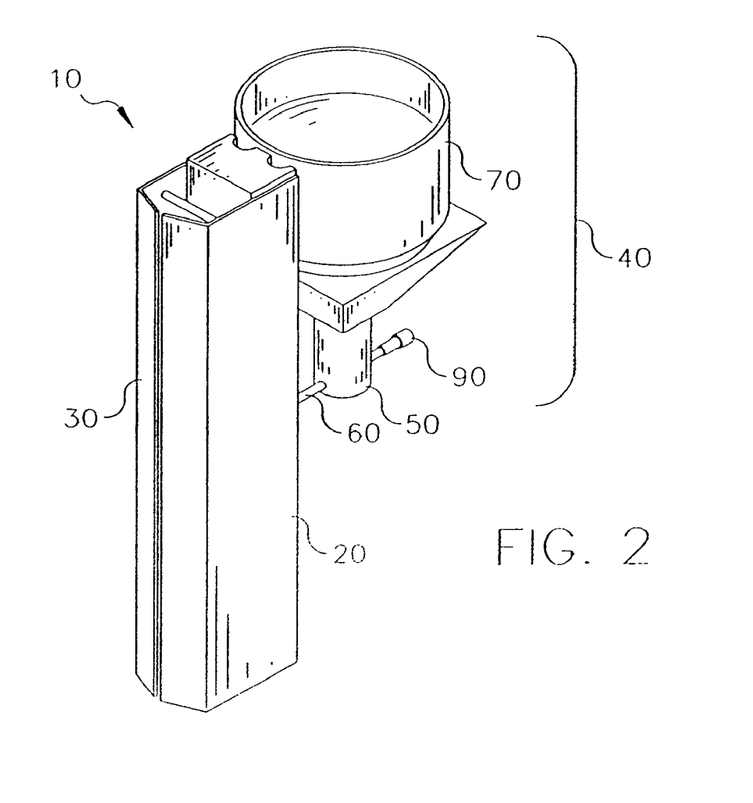
FIG. 2 is a three-dimensional view of one embodiment of an apparatus according to the present invention for vaporizing organic particulate materials and condensing them onto a surface to form a layer.

Turning now to FIG. 2, there is shown a three-dimensional view of one embodiment of an apparatus according to the present invention for vaporizing organic particulate materials and condensing them onto a surface to form a layer. Vaporization apparatus 10 includes manifold 20 and attached feeding apparatus 40. Feeding apparatus 40 includes at least first container 50 and feeding path 60, and can also include second container 70. First container 50 is provided with a quantity of organic material in a particulate form, such as a powder in one embodiment. Second container 70 can receive the organic particulate material and transfer it to first container 50 as will become evident. Manifold 20 includes one or more apertures 30 through which vaporized organic material can exit to a substrate surface. Manifold 20 is shown in an orientation whereby it can form a layer on a vertically-oriented substrate, but it is not limited to this orientation. Manifold 20 can be oriented horizontally and can form a layer on a horizontal substrate. Manifold 20 had been described in detail by Long et al. in commonly-assigned, above-cited U.S. patent application Ser. No. 10/784,585. Feeding apparatus 40 is shown attached to the bottom of manifold 20, that is, opposite to apertures 30, but feeding apparatus 40 can also be attached to a side of manifold 20. The nature of the attachment of feeding apparatus 40 to manifold 20 will become clear.

Figure 3:
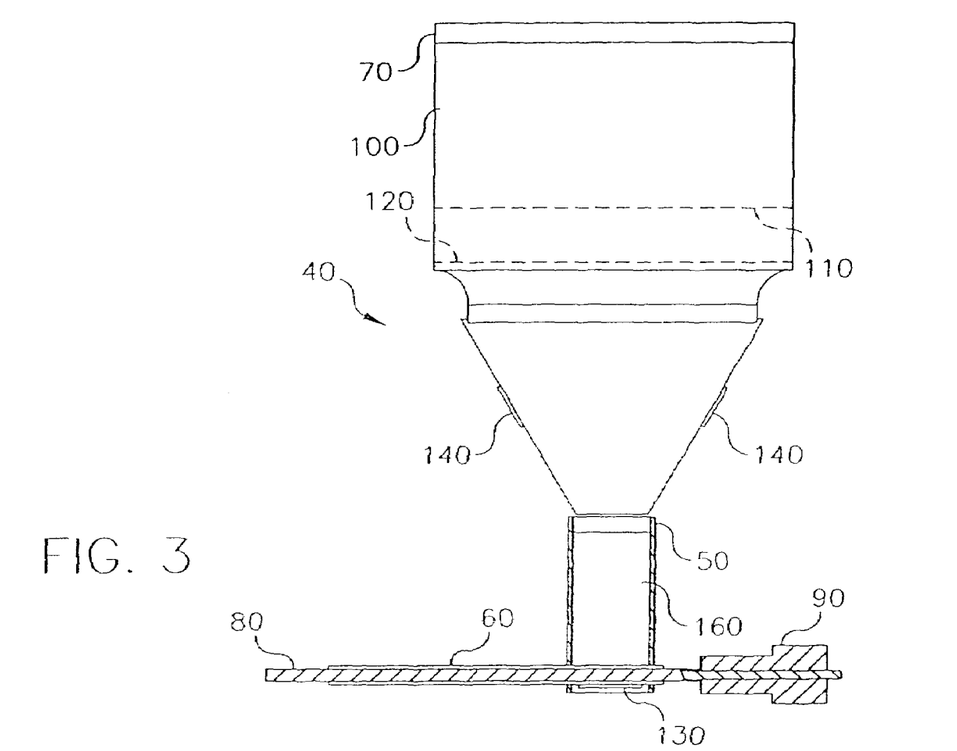
FIG. 3 is a cross-sectional view of one embodiment of a portion of the above apparatus for feeding particulate material according to the present invention, including one embodiment of an agitating device useful in the present invention.

Turning now to FIG. 3, there is shown a cross-sectional view of one embodiment of a portion of the above vaporization apparatus for feeding particulate material according to the present invention whereby organic material is effectively fluidized and transferred to the auger structure. First container 50 holds organic particulate material 160, which is in the form of a finely divided powder and is desirably of a uniform size, and which feeds into auger structure 80 in feeding path 60. Auger structure 80 passes through the interior of first container 50 and feeds into the manifold described above (not shown for clarity). At least a portion of auger structure 80 is rotated by motor 90 so as to transfer the organic particulate material at a controlled volumetric rate or pressure along feeding path 60 to a vaporization zone where the organic component material is vaporized and subsequently delivered to a substrate to form a layer. Feeding path 60, and therefore organic particulate material 160 flowing in feeding path 60, can be maintained at a temperature below the desired vaporization temperature of the organic component material. To facilitate the movement of organic particulate material 160 to auger structure 80, organic particulate material 160 may be fluidized by agitating organic particulate material 160 by using an agitating device, e.g. piezoelectric structure 130 or an electromechanical vibrator. Such fluidized material is more readily transferred to auger structure 80 by gravity feed.

The addition of optional second container 70 to hold additional organic particulate material 100 provides several additional advantages. A large quantity of organic particulate material 100 can be charged in the apparatus, allowing continuous operation of the device for extended periods of time. By sensing the quantity of organic particulate material 160 in first container 50, e.g. by measuring the height of the column of organic particulate material 160, one can selectively meter the amount of organic particulate material 100 transferred from second container 70 to first container 50 and provide a substantially constant volume of organic particulate material 160 in first container 50, e.g. ±5 $cm^3$. In practice, 10 $cm^3$ of organic particulate material 160 is loaded in first container 50. Some embodiments described herein have great process latitude with respect to reliable organic particulate material 160 feeding over a wide range of material height in the container and can be run nearly to exhaustion without failing to feed additional organic particulate material 160. However, it is believed that multi-component mixing homogeneity is fostered if an optimum material height is established and maintained in first container 50 to within ±10%. This minimizes variations in the feeding rate of organic particulate material 160 to feeding path 60. Also, second container 70 can be arranged to be refillable without affecting the operation of first container 50, allowing the device to be continuously operated for even longer periods of time. Organic particulate material 100 is maintained in second container 70 by e.g. screens 110 and 120, whose mesh size is chosen to prevent the free flow of powdered material. Screens 110 and 120 can also be the mechanism for providing measured quantities of organic particulate material 100 to move from second container 70 to first container 50. Screens 110 and 120 may be contacted by agitating devices (not shown) that can be actuated to cause a quantity of organic particulate material 100 to pass through the screen mesh. Such devices include those to vibrate the screen, or a movable arm immediately above or below the screen to allow selective agitation of screens 110 and 120. A commercial flour sifter is one such device well adapted for use in this application. In these sifters, three screens are used and the top surface of each screen is contacted by rotatable arms that extend radially from the center of the sifter. The arms have a V shaped cross section so as to force the powdered organic particulate material 100 into a converging space between the arm and the screen as the arm rotates to thereby force a controlled volume of powdered organic particulate material 100 through the screen. A sensing system based on the height of organic particulate material 160 in first container 50 (or on an integrated signal derived from the deposition rate and time of operation) can serve to actuate the devices agitating screens 110 and 120 so as to maintain a nearly constant volume of powdered organic particulate material 160 in first container 50. Agitating devices such as piezoelectric structures 140 prevent the buildup of organic particulate material 100 in the feed path to first container 50. Piezoelectric structures can be vibrated with multiple frequencies, e.g. a siren effect, to prevent the buildup of organic particulate material 100 at vibrational nodes.

For proper operation of feeding apparatus 40, it is important to maintain a uniform feed rate of organic particulate material 160. Organic particulate material 160 is generally provided in a powdered form. One important strategy for providing a free flow of organic particulate material 160 is to prevent bridging, a characteristic behavior of particulate materials such as powders that can occur when the powder particles self-assemble into a load-bearing structure about an opening or aperture and thereby obstruct the flow of powder through the opening. Bridging effects can occur, for example, when the dimensions of an aperture are too small to overcome a tendency of a particulate material to resist flow. Factors that may cause bridging can include particulate size relative to the aperture dimensions, humidity, electrostatic attraction between particles, vacuum levels, and friction. To alleviate this problem, the dimensions of an opening 230 at the interface of first container 50 and feeding path 60, as shown in FIG. 3, must be sufficiently sized to overcome the bridging characteristics of the powdered material. This sizing requirement is best determined empirically, taking into account worst-case conditions for the particular organic particulate material 160 that must be supplied, in a free flowing manner, to feeding path 60. Maintaining a nearly constant volume of organic particulate material 160 in first container 50 also helps to promote a constant feed rate of organic particulate material 160 to auger structure 80. By properly sizing opening 230 and maintaining a sufficient volume of organic particulate material 160 in first container 50, a uniform feed rate can be achieved for many types of powdered organic particulate material 160, providing a fluidized flow without requiring any supplemental form of agitation.

Where the opening 230 must be narrow, feed rate uniformity can be assured when the organic particulate material 160 in proximity to the infeed portion of the screw auger is maintained in a fluidized state by an agitating device. This can be accomplished by slowly agitating organic particulate material 160 immediately above the auger screw or by inducing vibration, e.g. by piezoelectric structure 130, into organic particulate material 160 that is tuned to induce liquid-like behavior of the powdered organic particulate material 160 but is not so energetic as to cause gas-like behavior.

Figure 4:
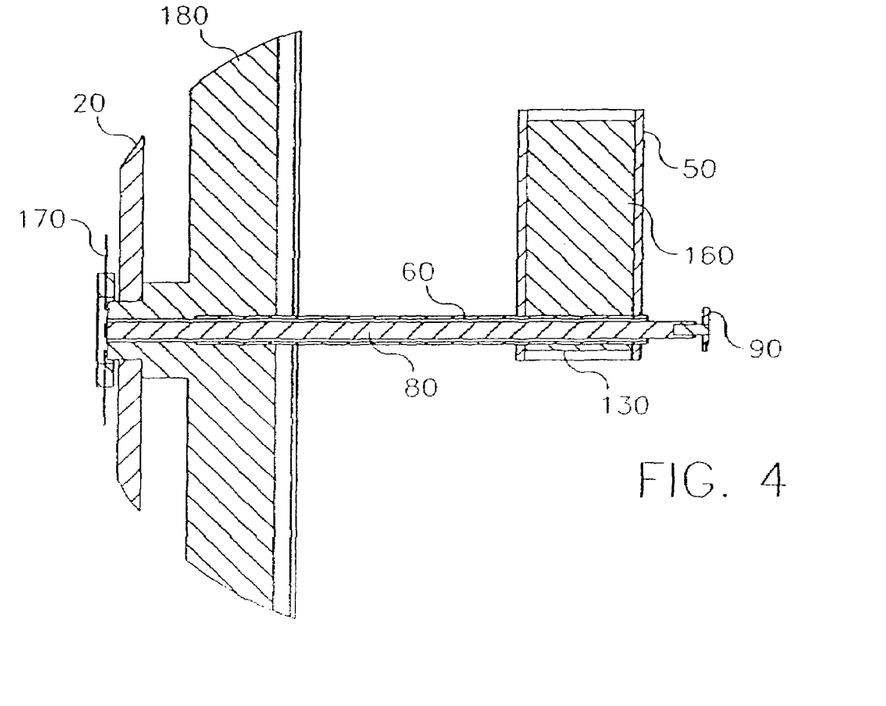
FIG. 4 is a cross-sectional view of one embodiment of a portion of the above apparatus for feeding and vaporizing organic particulate material according to the present invention.

Turning now to FIG. 4, there is shown in further detail a cross-sectional view of one embodiment of a portion of the above apparatus for feeding and vaporizing organic particulate material 160 according to the present invention. Auger structure 80 transfers powdered organic particulate material 160 along feeding path 60 into manifold 20 and heating element 170. Heating element 170 can be e.g. a heated screen and has been previously described in detail by Long et al. Manifold 20 includes a vaporization zone which is defined as the region of feeding path 60 immediately adjacent to heating element 170. A thin cross-section of powdered organic particulate material 160 is heated to the desired rate-dependent temperature, which is the temperature of heating element 170, by virtue of contact and thermal conduction, whereby the thin cross-section of powdered organic particulate material 160 vaporizes to be delivered to a substrate surface to form a layer. The auger structure 80 and its rotation rate control the rate at which organic particulate material 160 is fed to heating element 170. This linearly controls the rate of vaporization and therefore the rate at which organic particulate material 160 leaves the manifold in the vapor state. Thus the feed rate of the organic particulate material 160 to the auger structure 80 and to the vaporization zone controls the deposition rate of the vaporized organic particulate material 160 onto the desired surface.

Additionally, base 180 can be included. Base 180 is a heat-dissipating structure to prevent much of the heat from heating element 170 from traversing the length of feeding path 60, and thus keeps the bulk of the organic particulate material 160 significantly cooler than the conditions it experiences in the vaporization zone immediately adjacent to heating element 170. Means of heat dissipation for base 180 have been described by Long et al. in commonly-assigned, above-cited U.S. patent application Ser. No. 10/784,585. A steep thermal gradient thereby created protects all but the immediately vaporizing material from the high temperatures. The vaporized organic vapors rapidly pass through heating element 170 and can enter into the heated manifold 20. The residence time of organic particulate material 160 at the desired vaporization temperature is very short and, as a result, thermal degradation is greatly reduced. The residence time of the organic particulate material 160 at elevated temperature, that is, at the rate-dependent vaporization temperature, is orders of magnitude less than with prior art devices and methods (seconds vs. hours or days in the prior art), which permits heating organic particulate material 160 to higher temperatures than in the prior art. Thus, the current device and method can achieve substantially higher vaporization rates, without causing appreciable degradation of the components of organic particulate material 160.

Figure 5:
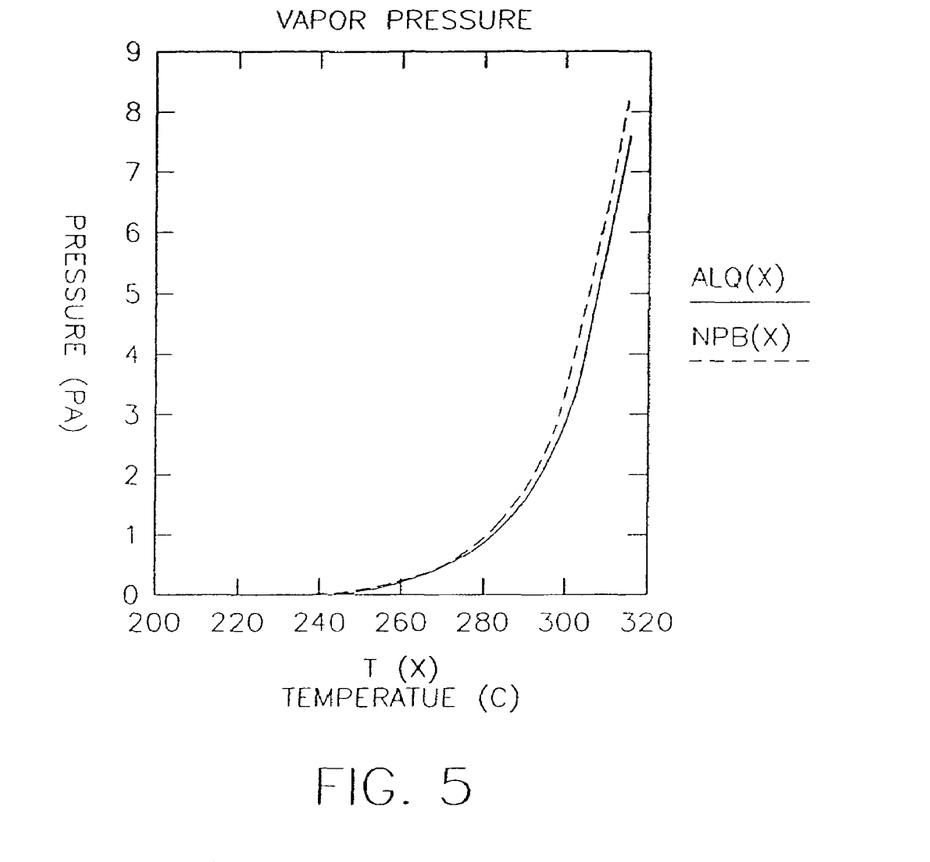
FIG. 5 shows a graphical representation of vapor pressure vs. temperature for two organic particulate materials.

The organic particulate material 160 can include a single component, or can include two or more different organic material components, each one having a different vaporization temperature. The vaporization temperature can be determined by various means. For example, FIG. 5 shows a graphical representation of vapor pressure versus temperature for two component organic materials commonly used in OLED devices. The vaporization rate is proportional to the vapor pressure, so for a desired vaporization rate, the data in FIG. 5 can be used to define the required heating temperature corresponding to the desired vaporization rate. In the case where the organic particulate material 160 includes two or more organic components, the temperature of heating element 170 is chosen such that the vaporization is feed-rate limited, that is, the vapor pressure at the heating element temperature is substantially above the desired partial pressure of that component in the manifold, so that each of the organic material components simultaneously vaporizes.

Pressure develops in manifold 20 as vaporization proceeds, and streams of vapor exit manifold 20 through the series of apertures 30 shown in FIG. 2. Because only a small portion of organic particulate material 160—the portion resident in the vaporization zone—is heated to the rate-dependent vaporization temperature, while the bulk of the material is kept well below the vaporization temperature, it is possible to interrupt the vaporization by a means for interrupting heating at heating element 170, e.g. stopping the movement of auger structure 80. This can be done when a substrate surface is not being coated so as to conserve organic particulate material 160 and minimize contamination of any associated apparatus, such as the walls of a deposition chamber, which will be described below.

Because heating element 170 can be a fine mesh screen that prevents powder or compacted material from passing freely through it, the manifold can be used in any orientation. For example, manifold 20 of FIG. 2 can be oriented downwards so as to coat a substrate placed below it. This is an advantage not found using the heating boats of the prior art.

Figure 6A:
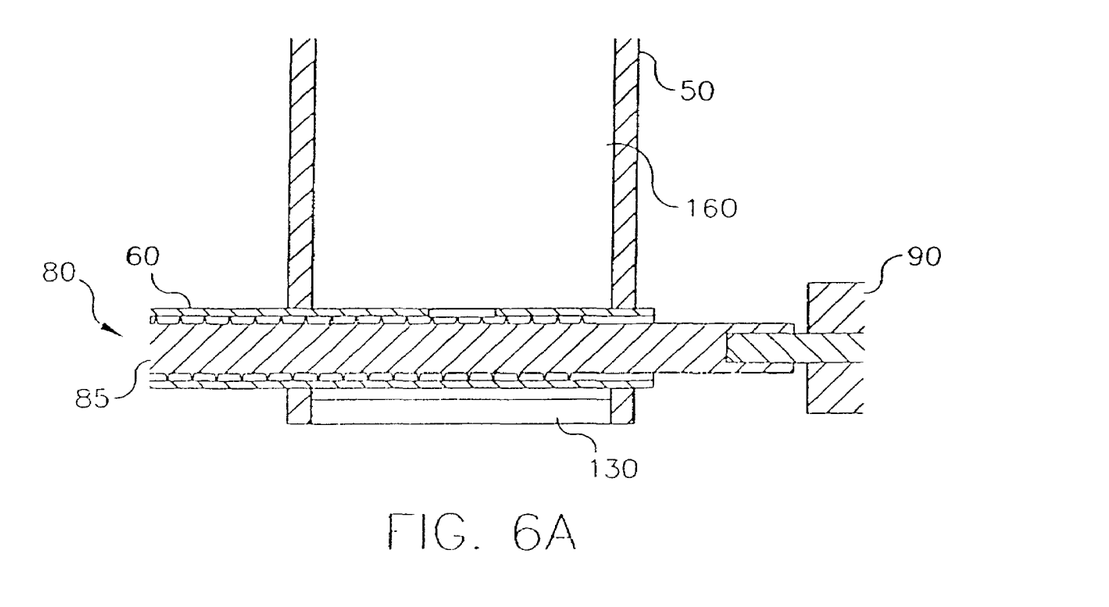
FIG. 6a is a cross-sectional view showing one embodiment of an auger structure useful in this invention.

Turning now to FIG. 6a, there is shown a cross-sectional view of one embodiment of an auger structure 80 useful in this invention. The auger structure 80 includes an auger screw 85 that is turned by motor 90. The distance between the threads of the screw helix and the thread height are chosen to be sufficiently large that powdered organic particulate material 160 tends not to pack into and rotate with the helix, but rather to remain at the bottom of a horizontally oriented auger tube and be transported linearly by virtue of the relative motion between the auger screw 85 and the auger tube. For example, an auger screw 85 with a 2.5 mm pitch screw lead and a 0.8 mm thread height has been found to be an effective combination in transporting and consolidating powdered organic particulate material 160 in a horizontal orientation.

The inventors have found that auger dimensions have an affect on maintaining a uniform flow rate. Similar to the bridging effects noted above with respect to the size of opening 230, proper auger sizing and screw thread pitch is best determined empirically, considering worst-case conditions for the particular composition of organic particulate material 160.

The inventors have also found that the angle of auger screw threads can be optimized to facilitate free flow of organic particulate material 160 along feeding path 60. While optimal screw thread angle may vary somewhat depending on the particular component materials of powdered organic particulate material 160, it has been determined that screw thread angles ranging from not less than about 4 degrees to no more than about 15 degrees relative to the rotational axis of auger structure 80 provide optimal flow conditions for the organic materials 160 that are conventionally used.

Various materials and surface treatments of the auger shaft have been found to facilitate auger operation, allowing increased feed rates. While stainless steel may provide acceptable performance, additional benefit may be obtained by surface treatments such as electropolishing or by coatings, such as a coating of titanium nitride.

While continuous auger rotation at a sustained rate may provide an acceptable level of performance, added benefits may be obtained by pulsing the auger, providing rotation of the auger shaft in a repeated incremental fashion. A pulsing action reduces the tendency for powdered organic particulate material 160 to rotate with the auger screw by reducing the effective coefficient of friction between the auger screw and the particulate material. The powder feeding efficiency of auger structure 80 is thereby improved. Pulsing behavior may also be advantageous where it becomes useful to vary the feed rate over an interval, for example.

Figure 6B:
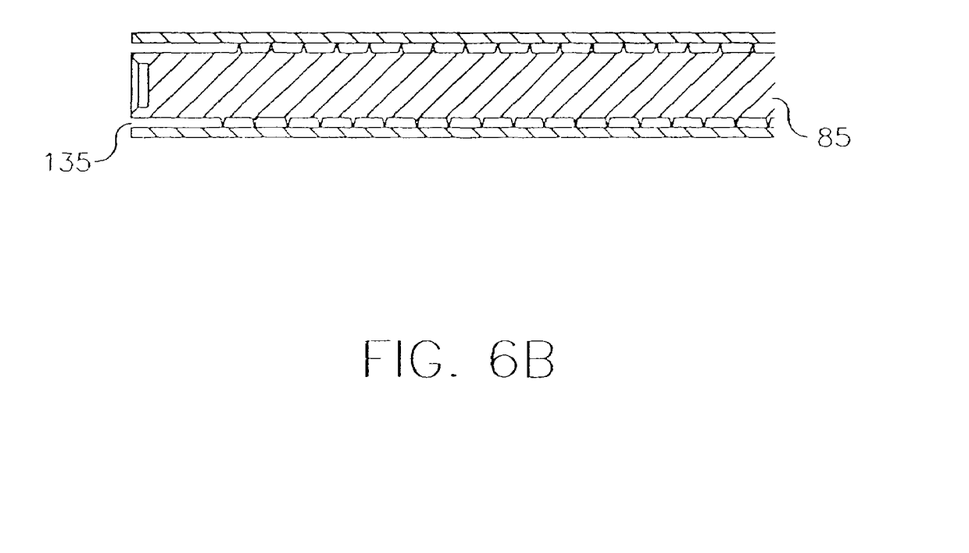
Figure 6C:
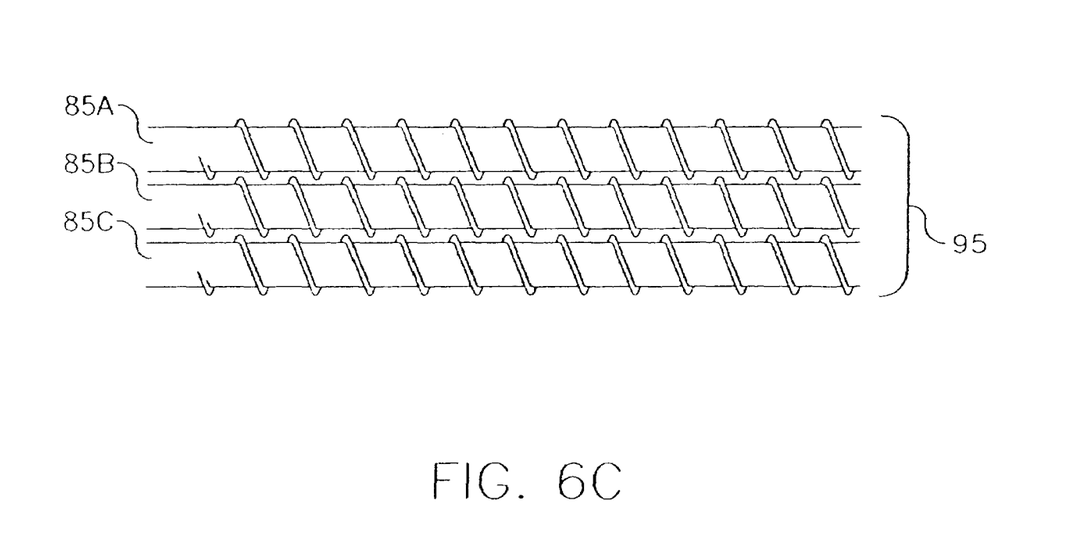
FIG. 6c is a relief view showing another embodiment of an auger structure useful in this invention.
Figure 6D:
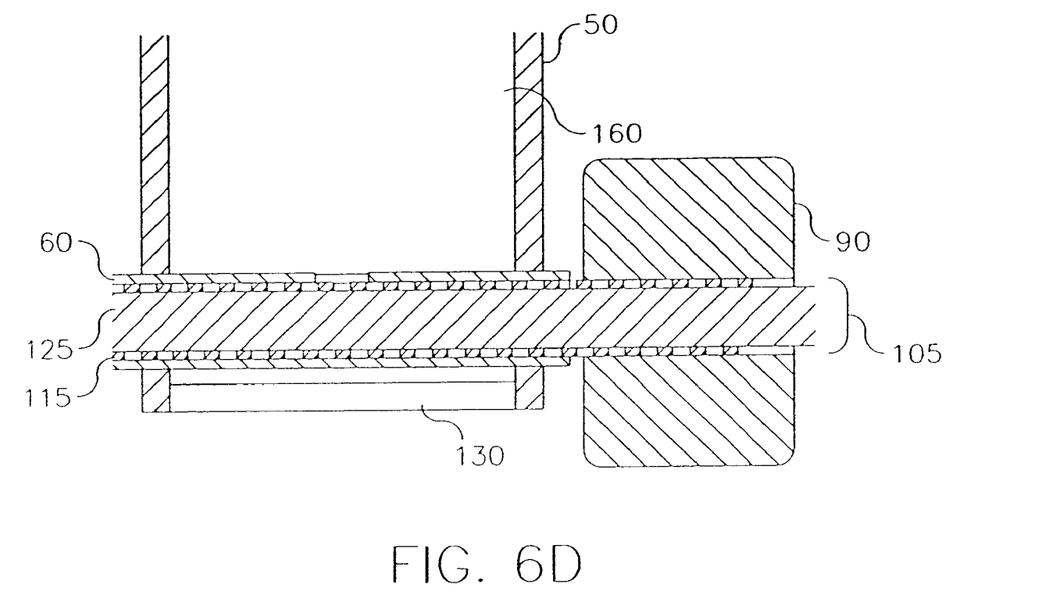
FIG. 6d is a cross-sectional view showing another embodiment of an auger structure useful in this invention.
Figure 7:
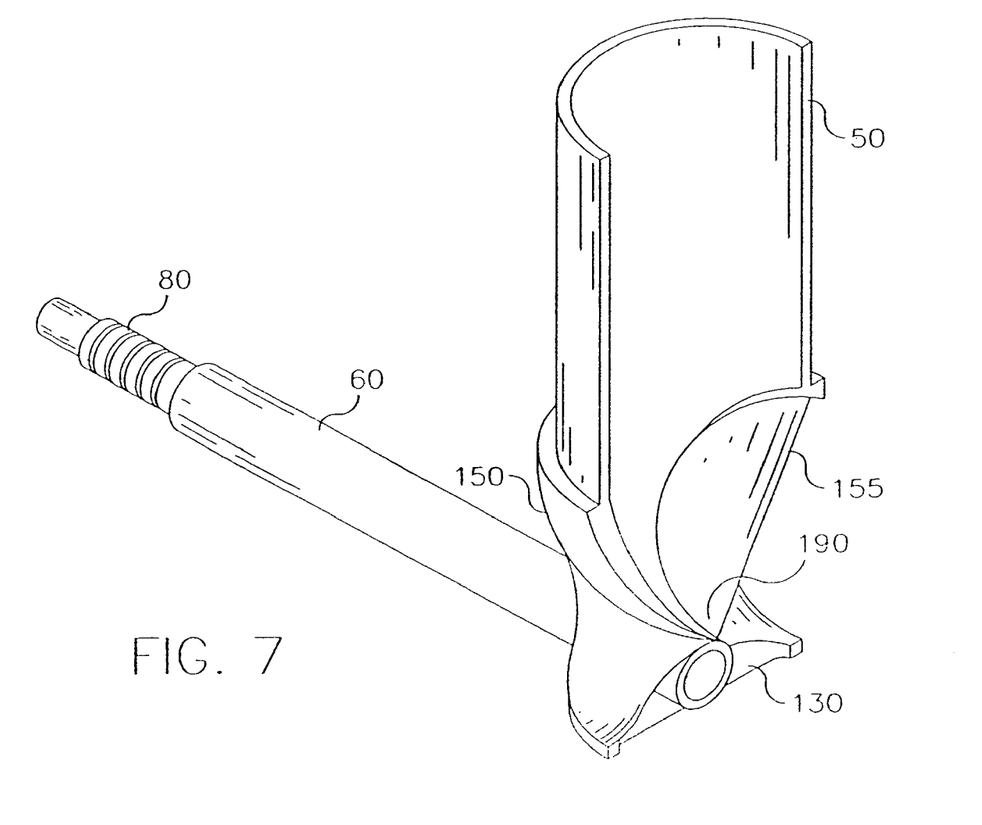
FIG. 7 is a cutaway view of another embodiment of an agitating device useful in the present invention.
Figure 8:
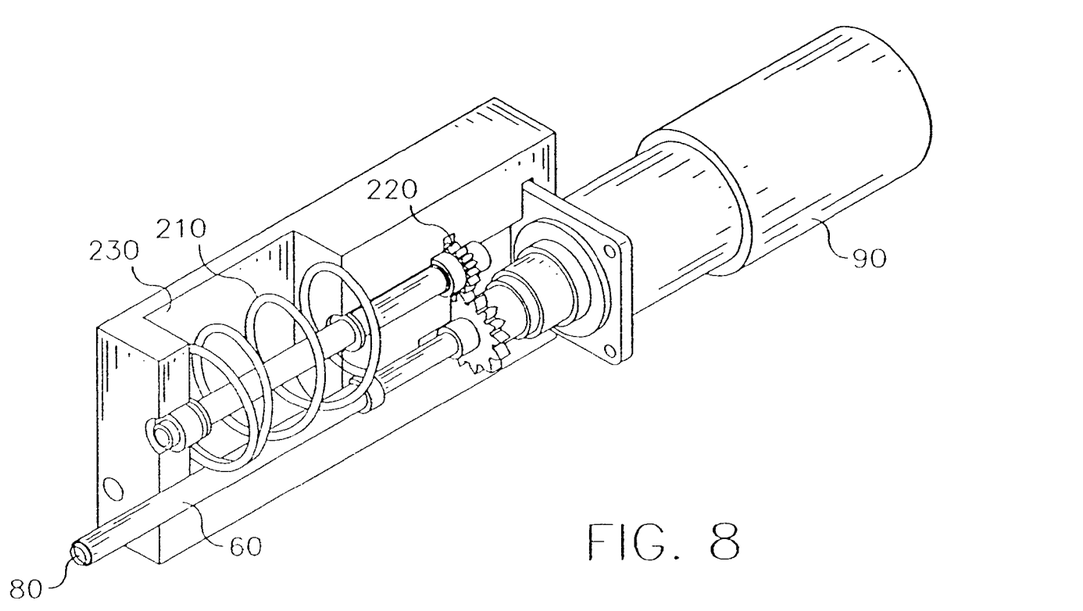
FIG. 8 is a cutaway view of another embodiment of an agitating device useful in the present invention.

In the horizontal orientation, the organic particulate material 160 travels along the bottom of auger screw 85 in a tumbling and dispersed form. At the terminal end of auger screw 85, a powder pressure of 1 Mpa can be developed that increases the bulk density of the organic particulate material 160 to the point where it serves as a vapor seal, preventing vaporized material in the manifold having a pressure greater than the ambient vacuum level from flowing back along the auger screw to its source at first container 50. As shown in FIG. 6b, the terminal end of auger screw 85 is configured to have a thread-free portion 135 having a constant circular cross section over a small length to constrain the consolidated powdered organic particulate material 160 to form a narrow annular or tubular shape. This narrow annular shape substantially improves the thermal contact and temperature uniformity through the organic particulate material 160, between the temperature-controlled auger screw 85 and the temperature-controlled feeding path 60. This configuration additionally assures good temperature uniformity of the organic particulate material 160 at a given transverse cross section relative to a circular cross section and substantially increases the attainable temperature gradient in the organic particulate material 160 between the auger structure 80 and the heating element 170. The powdered organic particulate material 160 is extruded from the auger structure in a tubular shape and is sufficiently consolidated that it can maintain the tubular extruded form for at least several millimeters upon exiting the support of the auger tube. This solid form prevents pressurized vapor, resulting from organic material vaporization, from flowing back into the auger structure 80 and enables the powdered organic particulate material 160 to bridge the short gap between the end of the temperature-controlled auger structure and the heating element.

Thermal modeling of a powder dispensing system having this annular configuration where the heating element is spaced 130 μm from the end of the auger structure 80 indicates that an average axial thermal gradient of 0.5° C./μm can be achieved through the organic particulate material 160 spanning the heating element 170 and the terminal end of the auger structure 80 when the temperature differential between the two is 270° C. There can therefore be a 100° C. temperature drop through the first 200 μm of consolidated powdered organic particulate material 160. This gradient prevents the usual leaching of more volatile constituents from bulk volumes of mixed-component organic materials and enables a single source to co-deposit multiple component organic materials.

This large gradient is further instrumental in maintaining the organic particulate material 160 in a consolidated powder form at the exit of the auger tube even when component organic materials that liquefy before vaporizing are employed.

The auger structure 80 shown in FIG. 6*a* is effective at transporting powdered organic particulate material 160 horizontally, but is not as effective in transporting powdered organic particulate material 160 vertically, since the powdered organic particulate material 160 tends to simply rotate with the screw and not advance along the length of the structure. Turning now to FIG. 6*c*, there is a relief view of another embodiment of an auger structure useful in this invention. In this embodiment, auger structure 95 includes two or more auger screws, e.g. auger screws 85*a*, 85*b*, and 85*c*, with identical interlaced helical threads. All of the auger screws 85*a*, 85*b*, and 85*c* rotate in the same direction. Organic material that is packed between the threads of one auger screw, e.g. 85*a*, will be removed as the material rotates into contact with the interlaced thread of the second rotating auger screw, e.g. 85*b*, because the facing portions of adjacent screws move in opposite directions. Auger structure 95 thus overcomes the orientation restrictions of the single-screw auger structure of FIG. 6*a* while retaining the ability to consolidate the powdered organic particulate material 160 into a solid shape and to form a vapor seal. The discharge portion of auger structure 95 would have an elongated cross-section that can extend across the entire length of the manifold so as to inject material substantially uniformly along its length.

Turning now to FIG. 6*d*, there is a cross-sectional view of another embodiment of an auger structure useful in this invention. Auger structure 105 includes a rotating helical thread 115, a stationary center portion 125, and a stationary outer tube, which in this case is feeding path 60. In this embodiment, only a portion of auger structure 105—the portion comprising helical threads 115—rotates and is turned by motor 90. Powdered organic particulate material 160 feeding with circular cross section helical threads has been demonstrated. The thread consisted of a steel wire 0.7 mm diameter formed into a helix of 5 mm outside diameter and 2.5 mm pitch. Smooth wires of other materials such as titanium and stainless steel are also suitable. The wire can also have a non-circular cross section, with a rectangular cross section being particularly advantageous as it provides additional rigidity to prevent the helical thread from changing dimensions as it encounters torsional resistance while pushing the powdered organic particulate material 160. Stationary center portion 125, in cooperation with feeding path 60, substantially prevents all but a thin film of powdered organic particulate material 160 from rotating with the auger. Auger structure 105 does not rely on gravity to accumulate powdered organic particulate material 160 and will operate in any orientation. Auger structure 105 also consolidates the powdered organic particulate material 160 into a thin annular shape that substantially improves the thermal contact between the powdered organic particulate material 160 and temperature-controlled feeding path 60 and stationary center portion 125. These characteristics are significant in enabling the controlled vaporization of mixed component organic materials, and component organic materials that liquefy before vaporizing. Thus this embodiment overcomes the orientation restrictions of the first auger structure while retaining the ability to consolidate the powdered organic particulate material 160 into a solid shape and form a vapor seal.

The above embodiments of this invention, based primarily on vaporization apparatus 10 of FIG. 2, are useful at atmospheric pressure and pressures down to about one-half atmosphere. Experimentally, it has been observed that fine powder is considerably more difficult to meter in a partial vacuum below half an atmosphere. The powdered organic particulate material 160 agglomerates as residual air molecules are removed, and undergoes a reduction of the elastic coupling between particles that is effective in communicating vibrational energy through powdered organic particulate material 160 under atmospheric conditions. This effect negatively influences the powder-feeding uniformity of the auger structure. Therefore, a different agitating device can be necessary. Turning now to FIG. 7, there is shown a cutaway view of another embodiment of an agitating device useful in the present invention for overcoming the limitations in low-pressure conditions. This embodiment employs three piezoelectric structures as the agitating device. Piezoelectric structures 150 and 155 are inclined at a steep angle and form opposite walls of a funnel at the bottom of first container 50. The bottom portion 190 of these two piezoelectric structures is not supported and leads directly to the infeed portion of auger structure 80. The unsupported portions of the piezoelectric structures 150 and 155 have high vibration amplitude and are effective in fluidizing powdered organic particulate material 160 in proximity to their surfaces. The third piezoelectric structure 130 is mounted below auger structure 80 and imparts vibration whose amplitude is essentially perpendicular to the vibration of the other two piezoelectric structures 150 and 155. The piezoelectric structures are driven by a frequency sweeping circuit. The changing frequency is instrumental in preventing the formation of nodes and improves the powder feeding efficiency considerably. Auger structure 80 can be any of the above-described auger structures.

FIG. 8 is a cutaway view of another embodiment of an agitating device useful in the present invention for overcoming the limitations in low-pressure conditions. Opening 230 represents the lower end of the above-described first container 50. Rotating thread type device 210 includes left- and right-hand helically wound wires on a common shaft. Rotating thread type device 210 is positioned above the infeed portion of the auger structure such that the wires are substantially tangent to the threads of auger structure 80. The rotating thread should not interfere with the auger screw threads, but it will continue to operate effectively with as much as 1 mm clearance. Rotating thread type device 210 is slowly rotated via gear drive 220, by motor 90, which also turns auger structure 80. In practice, the rotational speed of the rotating thread type device 210 can vary depending on the particle size and properties of the particular powdered organic particulate material 160, but a practical guide is to have the axial slew rate of the rotating thread match the axial slew rate of the threads of the auger screw. The wires of rotating thread type device 210 tend to push powdered organic particulate material 160 toward the center of opening 230 and prevent powder bridging over auger structure 80. Auger structure 80 can be any of the above-described auger structures. This agitating device is well adapted to feeding mixed-component organic materials as it imparts very little energy to powdered organic particulate material 160 and is therefore not likely to cause particle separation by size or density.

Figure 9:
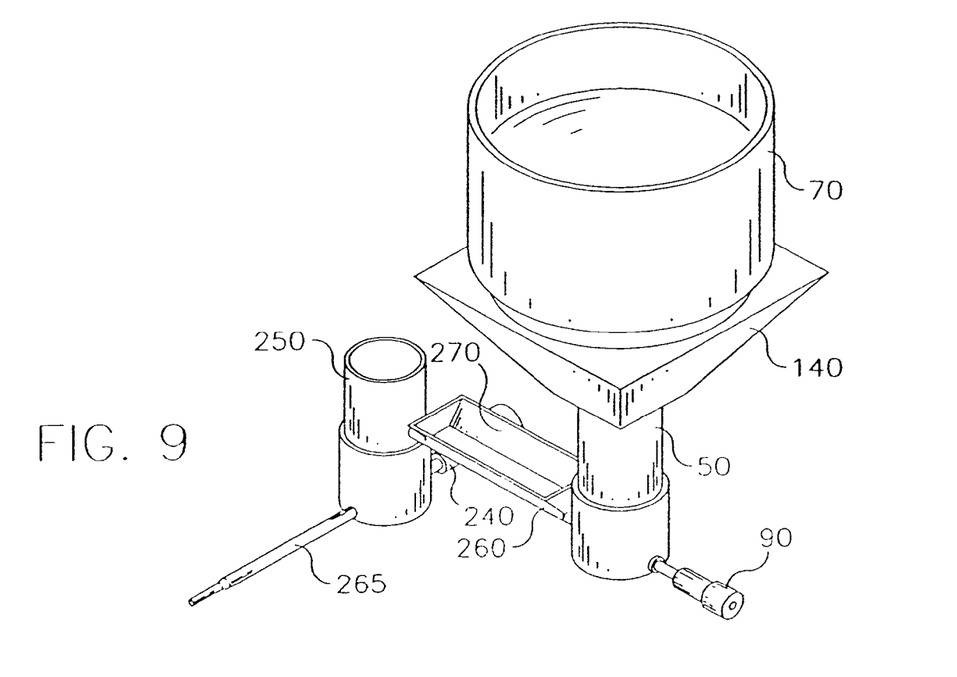
FIG. 9 is a three-dimensional view of a portion of another embodiment of an apparatus according to the present invention for vaporizing particulate organic materials and condensing them onto a surface to form a layer, including an apparatus to drive off adsorbed gasses or impurities.

Turning now to FIG. 9, there is shown a three-dimensional view of a portion of another embodiment of an apparatus according to the present invention for vaporizing powdered organic materials 160 and condensing them onto a surface to form a layer, including an apparatus for pre-conditioning organic particulate material 160 to drive off adsorbed gasses or impurities. The apparatus includes first container 50 as described above for holding a quantity of organic particulate material 160. The apparatus can also include a second container 70 for holding a reserve quantity of organic particulate material 100 that can be fed to first container 50. The apparatus can also include agitating devices such as piezoelectric structure 140 to facilitate the movement of organic particulate material 100 from second container 70 to first container 50. Organic particulate material 160 from first container 50 is fed into first feeding path 260 for pre-conditioning. First feeding path 260 includes an auger structure in association with first container 50 for transferring the organic particulate material 160 from first container 50 to first feeding path 260. At least a portion of the auger structure is turned by motor 240 to feed powdered organic particulate material 160 along first feeding path 260. First feeding path 260 includes vacuum exposure opening 270, which is in communication with a source of partial vacuum. First feeding path 260 can alternately be heated so as to heat the powdered organic particulate material 160 while exposing it to a partial vacuum so as to drive off adsorbed gasses or impurities as the organic particulate material 160 is transferred along first feeding path 260 to the vaporization zone as pre-conditioned organic particulate material 160. For typical deposition rates, the free powdered organic particulate material 160 has several minutes to liberate adsorbed water vapor and gas molecules in this pre-conditioning phase, just prior to being compacted and vaporized. The pre-conditioned powdered organic particulate material 160 is then transferred to second feeding path 265, which is defined by an auger structure as described above, in which it is consolidated, that is, it is compacted and evenly distributed around the auger structure. Powdered organic particulate material 160 is fed along second feeding path 265 by the auger structure to a manifold and vaporization zone (not shown) as described above, where the organic material is vaporized and subsequently condensed onto the surface of an OLED substrate to form an organic layer. Optional third container 250 can receive the exposed powdered organic particulate material 160 from first feeding path 260. In such a case, the auger structure that defines second feeding path 265 is also associated with third container 250 for feeding exposed powdered organic particulate material 160 to second feeding path 265, and such auger structure passes through the interior of third container 250. This apparatus also includes means for fluidizing the powdered organic particulate material 160, as already described. In an alternative embodiment, feeding path 260 includes vacuum exposure opening 270 and feeds directly to a manifold without the use of a second feeding path.

In practice, the apparatus described herein is operated as follows. A powdered organic particulate material 160, which is useful in forming a layer on an OLED device, is provided into second container 70. The organic particulate material 160 is transferred in a controlled manner to first container 50 in such a way as to maintain a substantially constant volume of powdered organic particulate material 160 in first container 50. The powdered organic particulate material 160 is fluidized by means described herein and thereby transferred to an auger structure 80, which transfers the powdered organic particulate material 160 to a vaporization zone as described herein. The organic particulate material 160 is vaporized in the vaporization zone into a manifold 20, which delivers the vaporized organic material to the surface of an OLED substrate to form a layer, as will be described below.

As has been noted hereinabove, vacuum levels may tend to complicate the problem of metering out uniform amounts of finely powdered organic materials 160. Referring back to FIG. 2, it can be observed that a continuous column of organic particulate material 160 is maintained in feeding path 60. In one embodiment, this column of organic particulate material 160, if suitably compacted, can be utilized as a type of vacuum seal, where particulate characteristics of organic particulate material 160 allow. With this arrangement, a high vacuum level can be present for organic particulate material 160 at heating element 170 and in the manifold 20. A lower vacuum level can then be maintained at first container 50, which may even be at atmospheric pressure. Even a partial seal could be advantageous. This sealing effect could also be used to isolate ambient gases used for storage of organic particulate material 160 in first container 50 and/or for organic particulate material 100 in second container 70. With some materials, for example, it is beneficial to store materials under an inert gas such as argon or helium.

Figure 10:
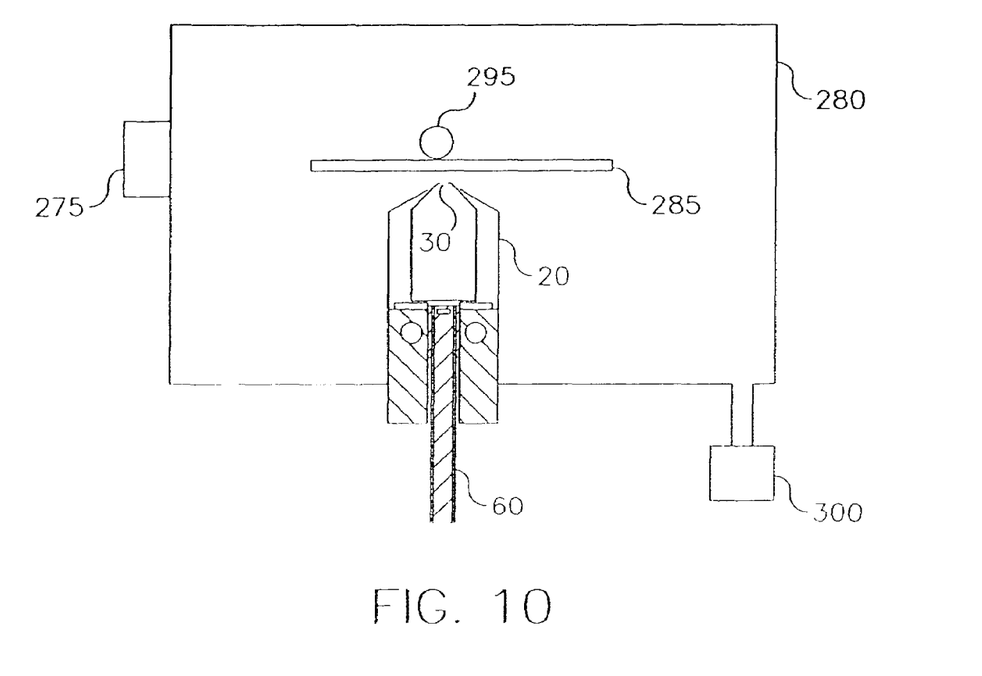
FIG. 10 is a cross-sectional view of a device according to the present invention including a deposition chamber enclosing a substrate.

Turning now to FIG. 10, there is shown an embodiment of a device of this disclosure including a deposition chamber enclosing a substrate. Deposition chamber 280 is an enclosed apparatus that permits an OLED substrate 285 to be coated with organic material transferred from manifold 20. Manifold 20 is supplied with organic material via feeding path 60 as described above. Deposition chamber 280 is held under controlled conditions, e.g. a pressure of 1 torr or less provided by vacuum source 300. Deposition chamber 280 includes load lock 275 which can be used to load uncoated OLED substrates 285, and unload coated OLED substrates. OLED substrate 285 can be moved by translational apparatus 295 to provide even coating of vaporized organic material over the entire surface of OLED substrate 285. Although vaporization apparatus is shown as partially enclosed by deposition chamber 280, it will be understood that other arrangements are possible, including arrangements wherein the entire vaporization apparatus, including any container or containers for holding the powdered organic particulate material 160, is enclosed by deposition chamber 280.

In practice, an OLED substrate 285 is placed in deposition chamber 280 via load lock 275 and held by translational apparatus 295 or associated apparatus. The vaporization apparatus is operated as described above, and translational apparatus 295 moves OLED substrate 285 perpendicular to the direction of emission of organic material vapors from manifold 20, thus delivering vaporized organic material to the surface of OLED substrate 285 to condense and form a layer of organic material on the surface.

Figure 11:
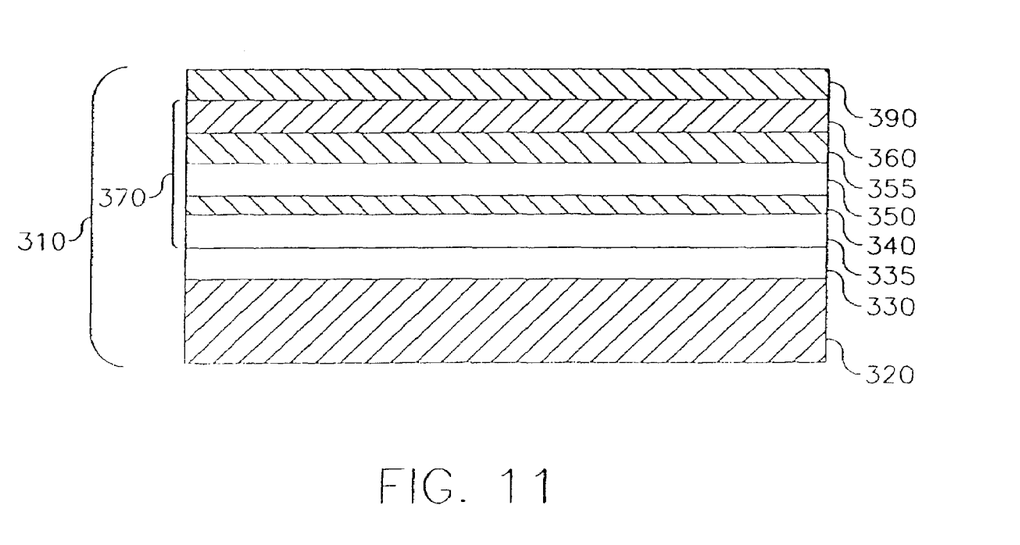
FIG. 11 is a cross-sectional view of an OLED device structure that can be prepared with the present invention.

Turning now to FIG. 11, there is shown a cross-sectional view of a pixel of a light-emitting OLED device 310 that can be prepared in part according to the present invention. The OLED device 310 includes at a minimum a substrate 320, a cathode 390, an anode 330 spaced from cathode 390, and a light-emitting layer 350. The OLED device can also include a hole-injecting layer 335, a hole-transporting layer 340, an electron-transporting layer 355, and an electron-injecting layer 360. Hole-injecting layer 335, hole-transporting layer 340, light-emitting layer 350, electron-transporting layer 355, and electron-injecting layer 360 include a series of organic layers 370 disposed between anode 330 and cathode 390. Organic layers 370 are the organic material layers most desirably deposited by the device and method of this invention. These components will be described in more detail.

Substrate 320 can be an organic solid, an inorganic solid, or a combination of organic and inorganic solids. Substrate 320 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 320 can be a homogeneous mixture of materials, a composite of materials, or multiple layers of materials. Substrate 320 can be an OLED substrate, that is a substrate commonly used for preparing OLED devices, e.g. active-matrix low-temperature polysilicon or amorphous-silicon TFT substrate. The substrate 320 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

An electrode is formed over substrate 320 and is most commonly configured as an anode 330. When EL emission is viewed through the substrate 320, anode 330 should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

While not always necessary, it is often useful that a hole-injecting layer 335 be formed over anode 330 in an organic light-emitting display. The hole-injecting material can serve to improve the film formation property of subsequent organic layers and to facilitate injection of holes into the hole-transporting layer. Suitable materials for use in hole-injecting layer 335 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide (VOx), molybdenum oxide (MoOx), nickel oxide (NiOx), etc. Alternative hole-injecting materials reportedly useful in organic EL devices are described in EP 0 891 121 A1 and EP 1 029 909 A1.

While not always necessary, it is often useful that a hole-transporting layer 340 be formed and disposed over anode 330. Desired hole-transporting materials can be deposited by any suitable means such as evaporation, sputtering, chemical vapor deposition, electrochemical means, thermal transfer, or laser thermal transfer from a donor material, and can be deposited by the device and method described herein. Hole-transporting materials useful in hole-transporting layer 340 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

A wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of Q1 or Q2 contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

B where:

$R_1$ and $R_2$ each independently represent a hydrogen atom, an aryl group, or an alkyl group or $R_1$ and $R_2$ together represent the atoms completing a cycloalkyl group; and

$R_3$ and $R_4$ each independently represent an aryl group, which is in turn substituted with a diaryl substituted amino group, as indicated by structural Formula C.

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

D wherein:
  each Are is an independently selected arylene group, such as a phenylene or anthracene moiety;
  n is an integer of from 1 to 4; and
  Ar, $R_7$, $R_8$, and $R_9$ are independently selected aryl groups.
  In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. The device and method described herein can be used to deposit single- or multi-component layers, and can be used to squentially deposit multiple layers.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layer 350 produces light in response to hole-electron recombination. Light-emitting layer 350 is commonly disposed over hole-transporting layer 340. Desired organic light-emitting materials can be deposited by any suitable means such as evaporation, sputtering, chemical vapor deposition, electrochemical means, or radiation thermal transfer from a donor material, and can be deposited by the device and method described herein. Useful organic light-emitting materials are well known. As more fully described in U.S. Pat. Nos. 4,769,292 and 5,935,721, the light-emitting layers of the organic EL element include a luminescent or fluorescent material where electroluminescence is produced as a result of electron-hole pair recombination in this region. The light-emitting layers can include a single material, but more commonly include a host material doped with a guest compound or dopant where light emission comes primarily from the dopant. The dopant is selected to produce color light having a particular spectrum. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. The device and method described herein can be used to coat multi-component guest/host layers without the need for multiple vaporization sources.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

E wherein:
  M represents a metal;
  n is an integer of from 1 to 3; and
  Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material in light-emitting layer 350 can be an anthracene derivative having hydrocarbon or substituted hydrocarbon substituents at the 9 and 10 positions. For example, derivatives of 9,10-di-(2-naphthyl)anthracene constitute one class of useful host materials capable of supporting electroluminescence, and are particularly suitable for light emission of wavelengths longer than 400 nm, e.g., blue, green, yellow, orange or red.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2, 2', 2"-(1,3,5-phenylene)tris[1-phenyl-1H-benzimidazole].

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distryrylbenzene or distyrylbiphenyl, bis(azinyl)methane boron complex compounds, and carbostyryl compounds.

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

While not always necessary, it is often useful that OLED device 310 includes an electron-transporting layer 355 disposed over light-emitting layer 350. Desired electron-transporting materials can be deposited by any suitable means such as evaporation, sputtering, chemical vapor deposition, electrochemical means, thermal transfer, or laser thermal transfer from a donor material, and can be deposited by the device and method described herein. Preferred electron-transporting materials for use in electron-transporting layer 355 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

An electron-injecting layer 360 can also be present between the cathode and the electron-transporting layer. Examples of electron-injecting materials include alkaline or alkaline earth metals, alkali halide salts, such as LiF mentioned above, or alkaline or alkaline earth metal doped organic layers.

Cathode 390 is formed over the electron-transporting layer 355 or over light-emitting layer 350 if an electron-transporting layer is not used. When light emission is through the anode 330, the cathode material can include nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through cathode 390, it must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

The invention has been described in detail with particular reference to certain preferred embodiments thereof, namely for delivery of organic particulate materials to a vaporization zone. However, it can be appreciated that the present invention applies more broadly to particulate materials, including organic and other types of particulate materials. The term "particulate materials" can include a broad range of substances in particulate form, including, but not limited to, crystals, nanotubes, powders, needles, flakes, and other solid materials that can be classified as discontinuous, for example. Moreover, the particulate materials may be provided in a mixture containing a quantity of inert material or materials acting as a carrier for the component material. Inert carriers could include other types of solid materials as well as pastes and liquids, particularly liquid materials having higher viscosities. Any inert material selected must be compatible with the vaporization process, such that the inert carrier is appropriately discarded before or during the vaporization of the component particulate material. For example, the inert carrier can be selected from materials having a much higher vaporization temperature than the desired particulate component material. As just one example, organic particulate material 100 (FIG. 3) could be a mixture containing sand and the particulate component material that is to be vaporized. The utilization of such an inert carrier, with suitable mixing techniques, would allow the metering of minute quantities of a component particulate material, such as an organic particulate material, for vaporization. It can thus be understood that variations and modifications can be effected within the spirit and scope of the invention.

| PARTS LIST | |
|---|---|
| 5 | vaporization device |
| 6 | source |
| 7 | source |

PARTS LIST -continued

| | |
|---|---|
| 8 | source |
| 9 | vapor plume |
| 10 | vaporization apparatus |
| 15 | substrate |
| 20 | manifold |
| 30 | aperture |
| 40 | feeding apparatus |
| 50 | first container |
| 60 | feeding path |
| 70 | second container |
| 80 | auger structure |
| 85 | auger screw |
| 85a | auger screw |
| 85b | auger screw |
| 85c | auger screw |
| 90 | motor |
| 95 | auger structure |
| 100 | organic particulate material |
| 105 | auger structure |
| 110 | screen |
| 115 | helical thread |
| 120 | screen |
| 125 | center portion |
| 130 | piezoelectric structure |
| 135 | thread-free portion |
| 140 | piezoelectric structure |
| 150 | piezoelectric structure |
| 155 | piezoelectric structure |
| 160 | organic particulate material |
| 170 | heating element |
| 180 | base |
| 190 | bottom portion |
| 210 | rotating thread type device |
| 220 | gear driver |
| 230 | opening |
| 240 | motor |
| 250 | third container |
| 260 | first feeding path |
| 265 | second feeding path |
| 270 | vacuum exposure opening |
| 275 | load lock |
| 280 | deposition chamber |
| 285 | OLED substrate |
| 295 | translational apparatus |
| 300 | vacuum source |
| 310 | OLED device |
| 320 | substrate |
| 330 | anode |
| 335 | hole-injecting layer |
| 340 | hole-transporting layer |
| 350 | light-emitting layer |
| 355 | electron-transporting layer |
| 360 | electron-injecting layer |
| 370 | organic layers |
| 390 | cathode |

The invention claimed is:

1. A method for vaporizing particulate materials and condensing them onto a surface to form a layer, comprising:
 (a) providing a quantity of particulate material in a first container having an opening,
  wherein the opening is dimensioned to allow free flow of the particulate material through the opening;
 (b) transferring such particulate material through the opening to an auger,
  wherein the auger comprises a helical thread having an angle between 4 and 15 degrees relative to the axis of the auger; and,
 (c) rotating at least a portion of the auger to transfer the particulate material from the first container along a feeding path to a vaporization zone where at least a component portion of the particulate material is vaporized and delivered to the surface to form the layer,
 wherein the auger size is selected to facilitate the free flow of the particulate material through the opening.

2. The method of claim 1, wherein the surface of the auger is coated with titanium nitride.

3. The method of claim 1, wherein the surface of the auger is electropolished.

4. A method for vaporizing particulate materials and condensing them onto a surface to form a layer, comprising:
 (a) providing a quantity of particulate material in a first container having an opening,
  wherein the opening is dimensioned to allow free flow of the particulate material through the opening and the particulate material is maintained in an inert gas;
 (b) transferring such particulate material through the opening to an auger; and,
 (c) rotating at least a portion of the auger to transfer the particulate material from the first container along a feeding path to a vaporization zone where at least a component portion of the particulate material is vaporized and delivered to the surface to form the layer,
 wherein the auger size is selected to facilitate the free flow of the particulate material through the opening.

* * * * *